United States Patent [19]

Ogou

[11] Patent Number: 5,317,578
[45] Date of Patent: May 31, 1994

[54] LASER LIGHT OUTPUT CONTROL APPARATUS

[75] Inventor: Kenji Ogou, Tenri, Japan

[73] Assignee: Sharp Kabushiki Kaisha, Osaka, Japan

[21] Appl. No.: 945,890

[22] Filed: Sep. 17, 1992

[30] Foreign Application Priority Data

Sep. 26, 1991 [JP] Japan ............................. 3-277200

[51] Int. Cl.⁵ ............................................. H01S 3/13
[52] U.S. Cl. ...................................... 372/29; 372/38; 372/31
[58] Field of Search ................... 372/29, 38, 31

[56] References Cited

U.S. PATENT DOCUMENTS

| | | | |
|---|---|---|---|
| 4,618,958 | 10/1986 | Shibata et al. | 372/29 |
| 4,663,760 | 5/1987 | Shimada et al. | 372/31 |
| 4,763,334 | 8/1988 | Shimada et al. | 372/29 |
| 4,853,934 | 8/1989 | Sakurai | 372/29 |
| 4,856,011 | 8/1989 | Shimada et al. | 372/38 |
| 4,912,714 | 3/1990 | Hatanaka et al. | 372/31 |

FOREIGN PATENT DOCUMENTS 62-130578 12/1987 Japan.

*Primary Examiner*—Georgia Y. Epps

[57] ABSTRACT

A laser light output control apparatus is provided with first and second D/A converters, a current source for supplying a laser with a current, a monitor circuit for monitoring a laser light, a comparator for comparing output of the second D/A converter with output of the monitor circuit, and a microcomputer for setting values in the first and second D/A converters. A value to be given to the first D/A converter to set the laser light output at a specified value P1 and a value to be given to the first D/A converter to set the laser light output at another specified value P2 are both stored in the microcomputer. The laser light outputs of these specified values are obtained by using a feedback by the monitor circuit and the comparator. For light output between the specified values P1 and P2, an optional output value between the specified values P1 and P2 is set by calculating by the microcomputer a value to be given to the first D/A converter.

6 Claims, 7 Drawing Sheets

LASER LIGHT OUTPUT CONTROL APPARATUS

BACKGROUND OF THE INVENTION

1. Field of the Invention

This invention relates to a laser light output control apparatus for a semiconductor laser.

2. Description of the Related Art

A semiconductor laser is used to obtain a laser light by energizing with a driving current IF through a p-n junction of a certain type. As shown in FIG. 5, the relation between the driving current IF and a light output intensity PO is not linear, but as the driving current IF increases, laser light oscillation starts at a certain current value Ith, and hereafter, the laser light output PO increases with increasing the driving current IF.

However, a threshold current Ith and the rate of change (differential efficiency $\eta$) of PO relative to the change of IF are not constant, but vary with the ambient temperature and also with individual lasers in which laser light oscillation takes place.

FIG. 6 is a block diagram of a laser light output control apparatus conventionally used to drive a semiconductor laser with a constant light output intensity.

Reference numeral 10 denotes an up/down counter which counts up an output value in accordance with an input clock signal when an output of a comparator 17 is at "H" level and then an UP/DOWN signal of the up/down counter 10 is at "H" level, and counts down the output value in accordance with the input clock signal when they are at "L" level.

The output value of the up/down counter 10 is converted by a D/A converter 12 into a laser driving current IF, and supplied through a current source 13 to a semiconductor laser 14 to drive the semiconductor laser 14. The light output PO of the laser 14 is converted by a monitor circuit 15 into a voltage, which is compared with a set voltage VM by a comparator 17.

The comparator 17 outputs a "H" level signal when the voltage from the monitor circuit 15 is lower than the set voltage VM and a "L" level signal when the voltage from the monitor circuit 15 is higher than the set voltage VM.

As described, the conventional laser light output control apparatus with the component parts mentioned above constitutes a negative feedback loop of the comparator 17. When control of the laser light output is started, the up/down counter 10 counts up, the output value of the D/A converter 12 and the laser driving current IF continue to increase and the laser light output increases gradually. After the monitor voltage obtained by monitoring the laser light exceeds the set voltage VM, the counter 10 counts up and down repeatedly, so that the light output PO comes to settle almost at a fixed value regulated by the set voltage VM.

FIG. 7 is a timing chart in a case where a laser light output control apparatus such as shown in FIG. 6 is used.

At the rising edge of a clock pulse (a) in FIG. 7, a counted-up value is output to the D/A converter 12 from the up/down counter 10, and accordingly, the driving current IF changes stepwise as illustrated in FIG. 7(b). When the driving current IF exceeds the threshold current Ith, the laser 14 starts oscillation, and increases the light output PO as shown in FIG. 7(c). As PO reaches to a target level, the counter 10 counts up and down at about that corresponding level, and therefore, IF fluctuates about a certain value, so that PO comes settle almost at the target level.

When the light output is to be set to some other value in the apparatus mentioned above, it is necessary to change the set voltage VM and start with counter actions. However, since the counter actions are performed by feeding the laser light back through the monitor circuit 15 and the comparator 17, a long time is always required for setting the laser light output.

SUMMARY OF THE INVENTION

It is therefore an object of the invention to provide a laser light output control apparatus capable of shortening a time required for setting the laser light output.

It is another object of the invention to provide a laser light output control apparatus capable of setting the laser light output without the counter actions.

These and other objects of the invention can be achieved by a laser light output control apparatus of the invention which comprises first and second D/A converters, a current source for supplying a laser with a current, a monitor circuit for monitoring a laser light, a comparator for comparing output of the second D/A converter with output of the monitor circuit, and a microcomputer for setting values in the first and second D/A converters, wherein a value to be given to the first D/A converter to set the laser light output at a specified value P1 and a value to be given to the first D/A converter to set the laser light output at another specified value P2 are both stored in the microcomputer, the laser light outputs being obtained by using a feedback by the monitor circuit and the comparator, and wherein for light output between the specified values P1 and P2, an optional output value between the specified values P1 and P2 is set by calculating by the microcomputer a value to be given to the first D/A converter.

Under this arrangement, if specified light outputs at two levels are set by counter actions at the beginning of driving the laser, for light output between those two levels a desired laser light output can be obtained by calculation by the microcomputer without its actions as a counter. Without counter actions, the time for setting light output can be reduced.

Further objects and advantages of the present invention will be apparent from the following description of the preferred embodiment of the invention as illustrated in the accompanying drawings.

However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

A preferred embodiment of the present invention will be described with reference to the accompanying drawings.

Figure 1:
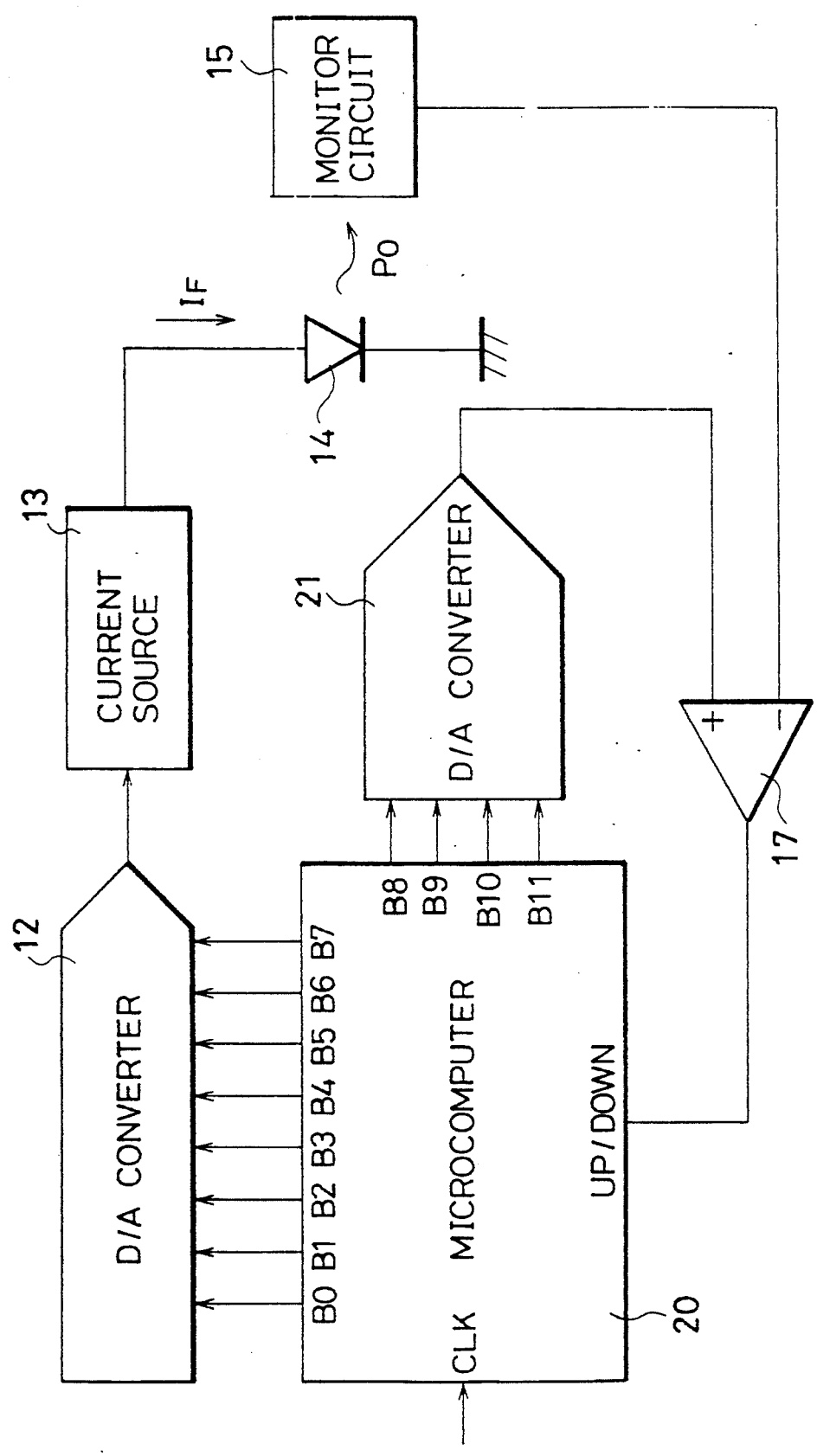
FIG. 1 is a block diagram of a laser light output control apparatus embodying the present invention.

FIG. 1 is a block diagram of a laser light output control apparatus embodying the present invention.

Figure 6:
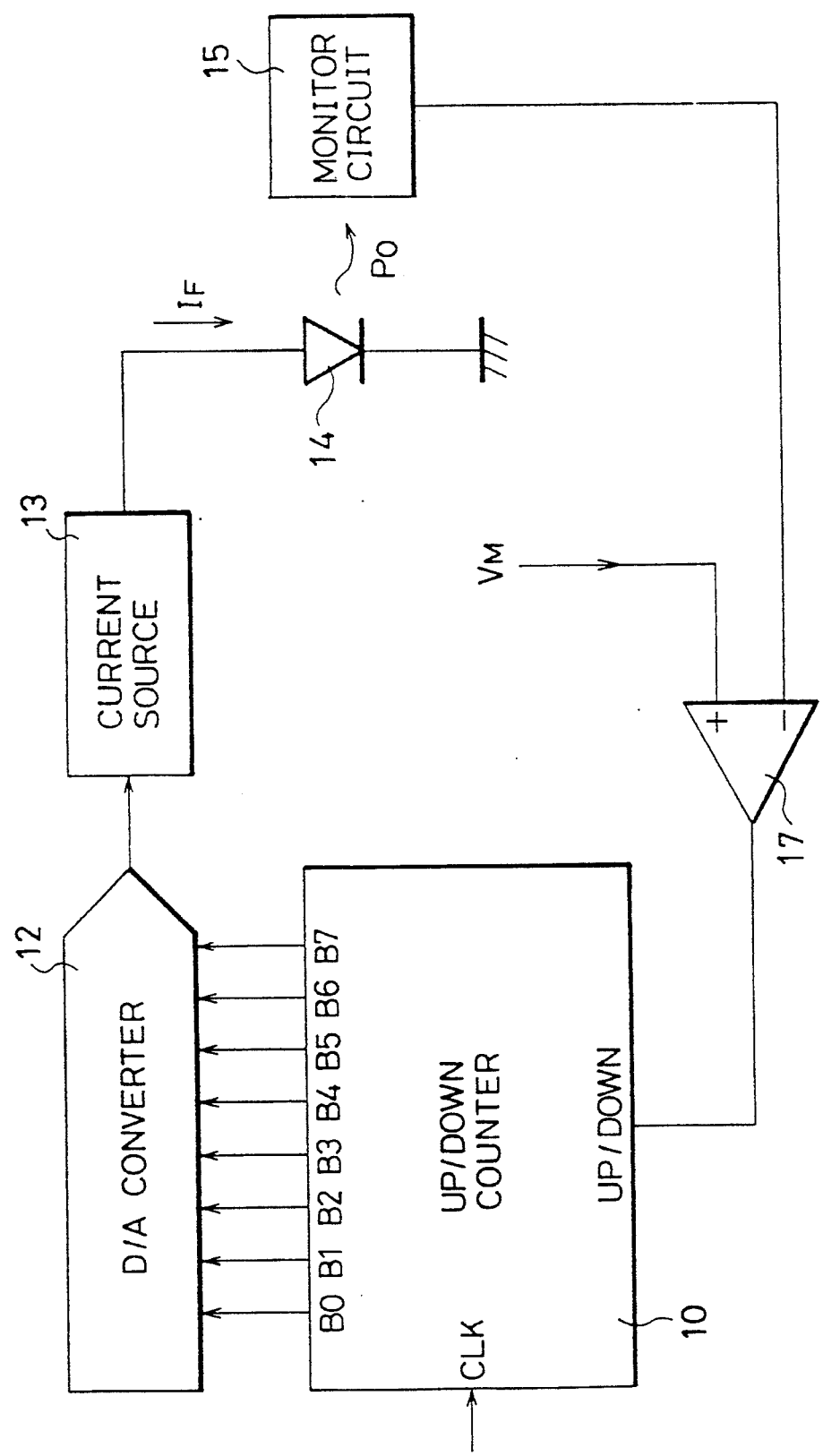
FIG. 6 is a block diagram of a conventional laser light output control apparatus.
Figure 7:
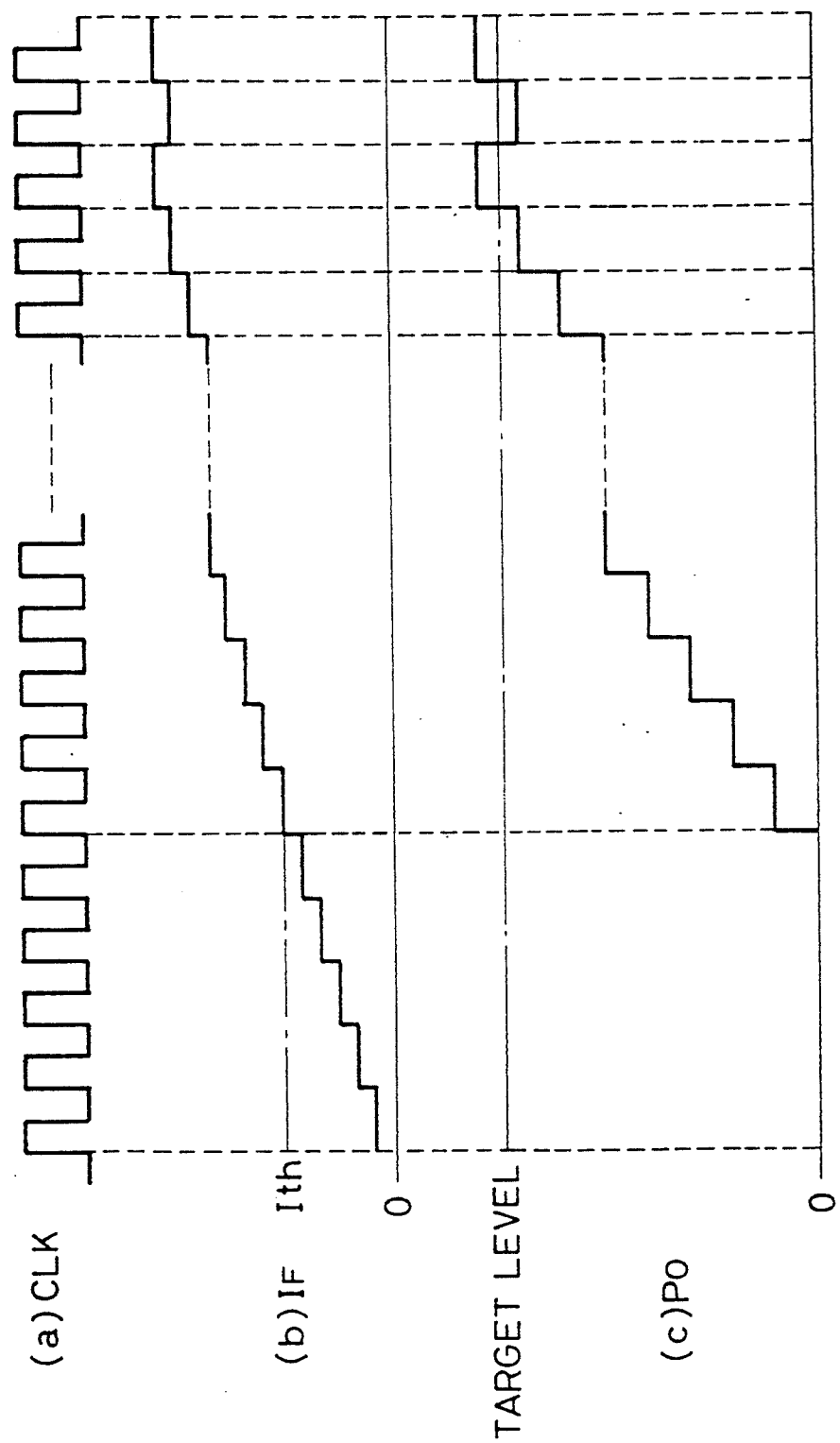
FIG. 7 is a timing chart in a case a conventional laser light output control apparatus is used.

As shown in FIG. 1, there is provided a microcomputer 20 having the function of an up/down counter, a calculating function, and a memory, which is used in place of the up/down counter in the conventional apparatus in FIG. 6. A D/A converter 21 serves to input a set voltage to a comparator 17.

Figure 2:
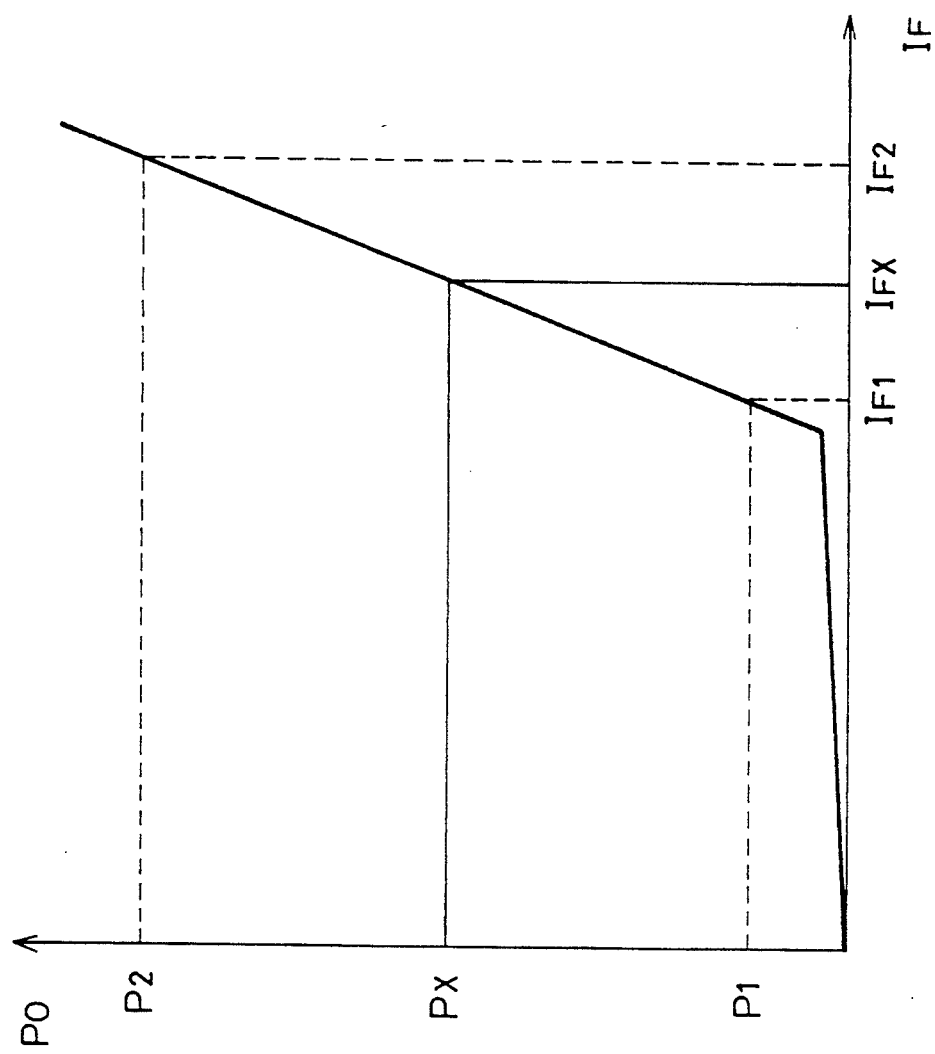
FIG. 2 is a diagram for explaining the method according to the present invention by laser driving current vs. light output characteristics.
Figure 5:
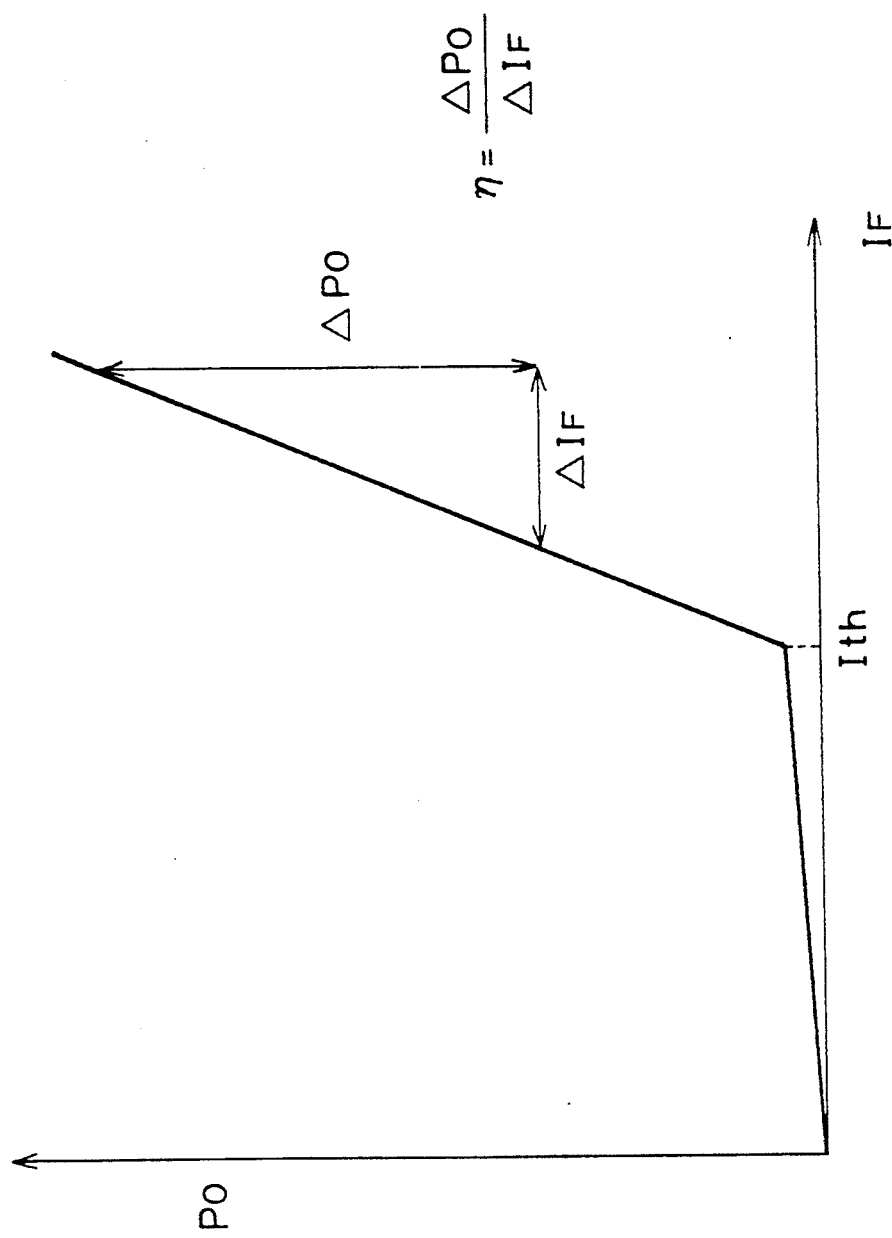
FIG. 5 is a diagram showing laser driving current vs. light output characteristics.

As shown in FIG. 5, in the present invention, control of the laser light output is performed by the following method made with attention directed to a fact that the laser driving current vs. light output characteristics are almost linear after the driving current exceeds Ith. More specifically, to set PX within the range from P1 to P2 in FIG. 2, the first thing to do is to store in the memory of the microcomputer 20 an output value to the D/A converter 12 from the microcomputer 20 to supply a driving current IF1 when the light output is set at P1 and also an output value to the D/A converter 12 from the microcomputer 20 to supply a driving current IF2 when the light output is set at P2, those light outputs being obtained by using a feedback by a monitor circuit 15 and a comparator 17 as in the prior art. Then, to set the light output at a desired level of PX, from the above-mentioned two values, the microcomputer 20 calculates an output value to the D/A converter 12 to obtain PX using the linear relation between a laser light output level and a laser driving current. As an output value corresponding to PX is output to the D/A converter, an IFX is supplied to the laser 14, so that the light output of the laser is PX. When another value is set for the light output, it is only necessary to have the microcomputer 20 perform calculations and output a calculated value to the D/A converter 12.

Figure 3:
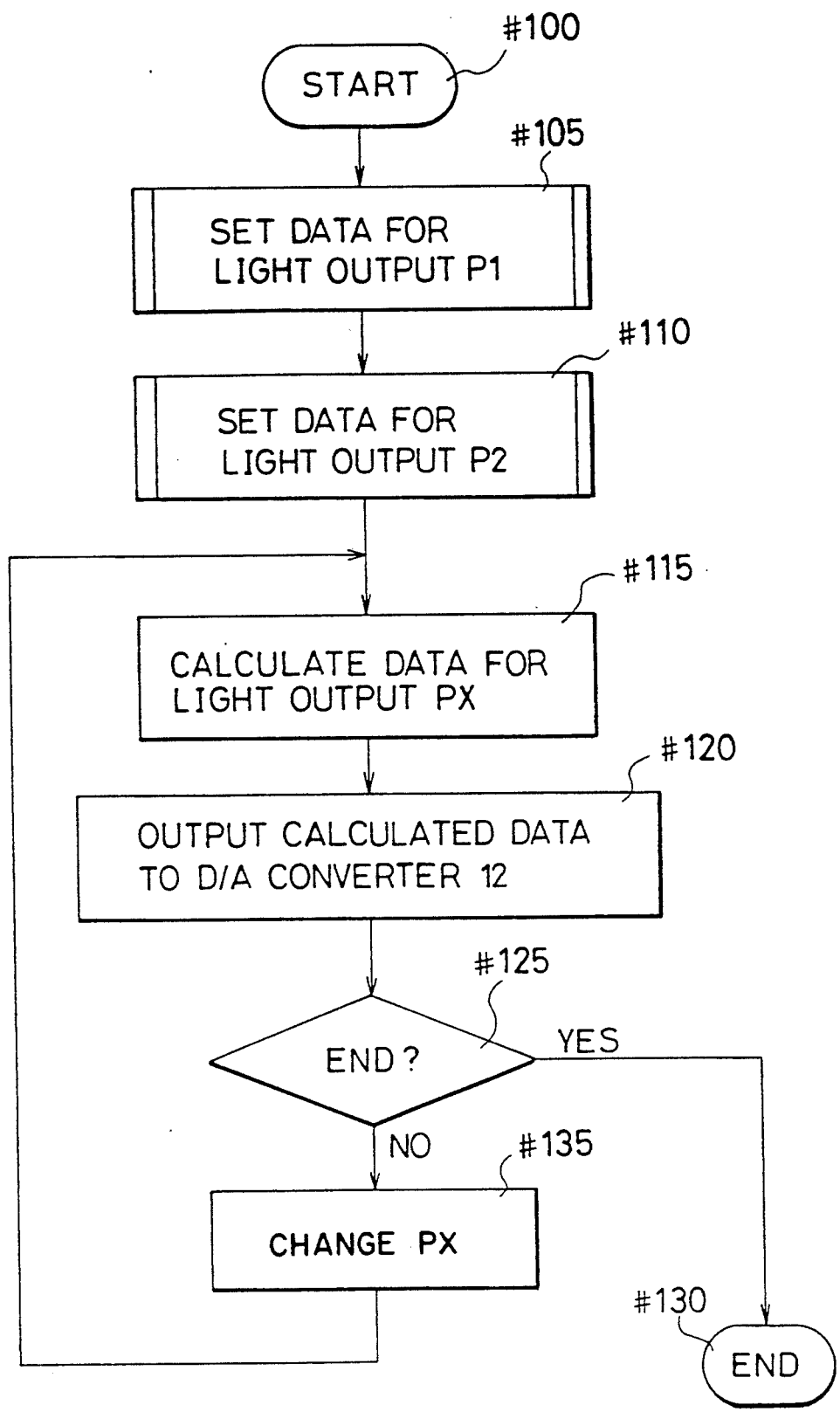
FIG. 3 is a flowchart of laser light output control.
Figure 4:
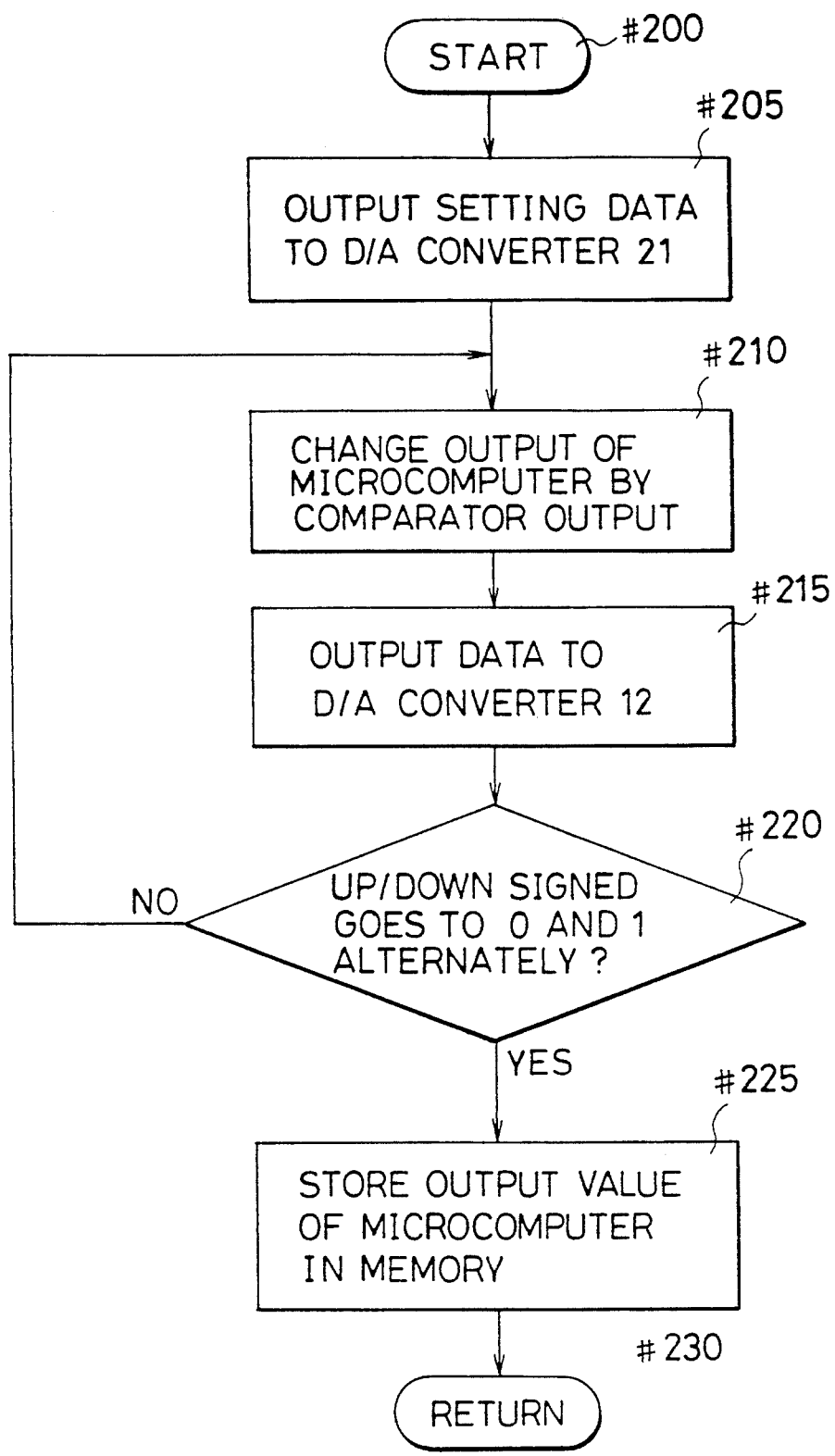
FIG. 4 is a flowchart of a subroutine of laser light output control.

FIGS. 3 and 4 are flowcharts for control the laser light output according to the present invention.

When control is started at step #100, a data setting subroutine for light output P1 is executed at step #105. As will be described when reference is made to FIG. 4, this is a routine for obtaining an output value to the D/A converter 12 to set the light output at P1 and storing the output value in the memory of the microcomputer 20. Next, a data setting subroutine for light output P2 is executed at step #110. By the above-mentioned two steps, output values have been decided which are given to the D/A converter 12 to set light outputs P1 and P2, and these output values are stored in the memory of the microcomputer 20.

Subsequently, at step #115, an output value is calculated which is given to the D/A converter 12 for a desired light output PX. If a current corresponding to P1 is denoted by IF1 and a current corresponding to P2 is denoted by IF2, the laser driving current IFX corresponding to PX is substantially expressed by the following equation.

$$IFX = IF1 + (IF2 - IF1) \times (PX - P1)/(P2 - P1)$$

The output value to the D/A converter 12 is normally in proportional relation with the laser driving current. Therefore, by replacing the driving current parts with output values, an output value corresponding to PX can be calculated from the output values at light outputs P1 and P2 stored previously.

At step #120, a calculated value is output to the D/A converter 12. In this way, the laser light output is set at PX.

At step #125, a decision is made whether or not to end this routine. To end the laser light output control, the control is ended with step #130. When the control is not ended, PX is changed at step #135, the process returns to step #115 and the output value to the D/A converter 12 is calculated again.

FIG. 4 shows a flowchart of a data setting subroutine for light output P1, which is called at step #105 of the main routine of FIG. 3. Though the process at step #105 is so arranged as to be executed in a subroutine for the sake of explanation, this does not mean that this process must be executed in a subroutine.

When this subroutine is started at step #200, setting data (voltage) corresponding to light output P1 is supplied to the D/A converter 21 at step #205. The data is expressed as 0001, for example.

At step #210, by output of the comparator 17, or an UP/DOWN signal of the microcomputer 20, the output value of the D/A converter 12 is changed. At step #215, the changed value is output to the D/A converter 12. Steps #210 and #215 are repeated until the UP/DOWN signal goes to "H" and "L" levels alternately (a decision is made at step #220).

If it has been confirmed that the UP/DOWN signal goes to "H" and "L" levels alternately, it follows that the output value to the D/A converter 12 at this moment is the value to set light output P1. Therefore, at step #225, this value is stored in the memory and the process returns to the calling routine at step #230.

In a data setting subroutine for light output P2 which is executed at step #110 of the main routine of FIG. 3, naturally, setting data for light output P2 is used (1111, for example) at step #205 in FIG. 4, which is only difference from the subroutine for light output P1. Therefore, a flowchart for this purpose and its description are omitted. Like in step #105, the process at step #110 need not be executed in a subroutine.

In the description of this embodiment, an 8-bit D/A converter 12 and a 4-bit D/A converter 21 are used, but the numbers of bits of those D/A converters are not limited to these numbers.

Meanwhile, the characteristics of the laser are subject to change under the influence of change with the passage of time and change in the ambient temperature. Therefore, in practical application of the present invention, refreshing the output values to the D/A converter 12 in the memory of the microcomputer 20 when light outputs are set at P1 and P2 should preferably be done at certain time periods.

As has been described, the present invention has obviated the need to change the set light outputs of the laser by counter actions which take place while output is feedback to the input. Therefore, the light output of the laser can be set arbitrarily and at high speed. This will contribute to the performance improvement of laser-applied systems, such as photomagnetic disk system and laser printers.

Many widely different embodiments of the present invention may be constructed without departing from the spirit and scope of the present invention. It should be understood that the present invention is not limited to the specific embodiment described in the specification, except as defined in the appended claims.

What is claimed is:

1. A laser light output control apparatus for controlling a laser light output from a semiconductor laser, comprising:

current applying means for applying a driving current to said semiconductor laser based on a given value;

a microcomputer including
      memory means having a capacity for storing first and second values to be given to said current applying means to set the laser light output at first and second output values, respectively,
      supplying means for supplying said first and second values, respectively, to said memory means to store said first and second values in said memory means, having
      voltage value outputting means for outputting first and second set voltage values, respectively, corresponding to said first and second output values of laser light outputs, and
      counting means for generating an output signal to be given to said current applying means, and
      calculating means for calculating a value to be given to said current applying means for the laser output between said first and second output values from said stored first and second values;

monitoring means for monitoring a laser light from said semiconductor laser and outputting monitor voltage; and comparing means for comparing said monitor voltage output of said monitoring means with said first and second set voltage values, respectively, and outputting comparing result signal to be supplied to said counting means to change gradually a value of said output signal of said counting means.

2. A laser light output control apparatus according to claim 1, wherein said current applying means includes a digital to analog converter and a current source.

3. A laser light output control apparatus according to claim 1, wherein said counting means includes an up and down counter for counting input clock signals, having an up/down terminal connected to said comparing means to receive said comparing result signal for switching between up counter function and down counter function.

4. A laser light output control apparatus according to claim 2, wherein said comparing means includes another digital to analog converter.

5. A laser light output control apparatus according to claim 4, wherein said microcomputer has an output port for outputting a digital value to be applied to said applying means and another output port for outputting a digital value to be applied to said comparing means.

6. A laser light output control apparatus according to claim 3, wherein said supplying means further includes judging means for judging as to whether the comparing result signal goes to 0 and 1 alternatively, and writing means for writing a current output value of the counting means into the memory if said judging means judges the comparing result signal goes to 0 and 1 alternatively.

* * * * *